(12) United States Patent
Watso et al.

(10) Patent No.: US 8,823,918 B2
(45) Date of Patent: Sep. 2, 2014

(54) LITHOGRAPHIC APPARATUS AND A METHOD OF OPERATING THE APPARATUS

(75) Inventors: Robert Douglas Watso, Delevan, NY (US); Youri Johannes Laurentius Maria Van Dommelen, Ballston Lake, NY (US); Johannes Henricus Wilhelmus Jacobs, Eindhoven (NL); Hans Jansen, Eindhoven (NL); Martinus Hendrikus Antonius Leenders, Rhoon (NL); Jeroen Johannes Sophia Maria Mertens, Duizel (NL); Peter Paul Steijaert, Eindhoven (NL); Anthonius Martinus Cornelis Petrus De Jong, Pijnacker (NL); Jimmy Matheus Wilhelmus Van De Winkel, Kessel (NL); Joao Paulo Da Paz Sena, Eindhoven (NL); Maurice Martinus Johannes Van Der Lee, Eindhoven (NL); Henricus Martinus Dorotheus Van Lier, Naer (NL); Gheorghe Tanasa, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 493 days.

(21) Appl. No.: 12/428,237

(22) Filed: Apr. 22, 2009

(65) Prior Publication Data

US 2009/0284715 A1 Nov. 19, 2009

Related U.S. Application Data

(60) Provisional application No. 61/071,361, filed on Apr. 24, 2008, provisional application No. 61/129,871, filed on Jul. 25, 2008.

(51) Int. Cl.
*G03B 27/52* (2006.01)
(52) U.S. Cl.
USPC ................................. 355/30; 355/53; 355/72
(58) Field of Classification Search
USPC .......................................... 355/30, 55, 72, 73
See application file for complete search history.

(56) References Cited

U.S. PATENT DOCUMENTS 4,509,852 A   4/1985  Tabarelli et al.
6,226,073 B1 * 5/2001  Emoto ............................ 355/53

(Continued)

FOREIGN PATENT DOCUMENTS

EP   1420299 A2   5/2004
EP   1420300 A2   5/2004

(Continued)

OTHER PUBLICATIONS

Korean Office Action dated Feb. 9, 2011 in corresponding Korean Patent Application No. 10-2009-0036247.

(Continued)

*Primary Examiner* — Glen Kao
(74) *Attorney, Agent, or Firm* — Pillsbury Winthrop Shaw Pittman LLP

(57) ABSTRACT

A lithographic projection apparatus is disclosed which includes a cleaning station. Several embodiments of the cleaning station are disclosed. In an embodiment, measures are taken to avoid contact of a cleaning fluid with the final element of the projection system. In an embodiment, measures are taken to avoid foaming of the cleaning fluid. The use of a thermally isolated island is also disclosed as well as its optimal position.

20 Claims, 12 Drawing Sheets

(56) References Cited

U.S. PATENT DOCUMENTS

| | | |
|---|---|---|
| 7,388,649 B2 | 6/2008 | Kobayashi et al. |
| 7,474,379 B2 | 1/2009 | Donders et al. |
| 7,804,576 B2 | 9/2010 | Fujiwara et al. |
| 7,855,777 B2 * | 12/2010 | Nagasaka ........................ 355/53 |
| 7,900,641 B2 | 3/2011 | De Jong et al. |
| 2004/0136494 A1 | 7/2004 | Lof et al. |
| 2004/0207824 A1* | 10/2004 | Lof et al. ........................ 355/30 |
| 2004/0261823 A1* | 12/2004 | de Larios ........................ 134/31 |
| 2005/0018155 A1* | 1/2005 | Cox et al. ........................ 355/30 |
| 2005/0225734 A1* | 10/2005 | De Smit et al. ................. 355/30 |
| 2006/0023185 A1* | 2/2006 | Hazelton et al. ................ 355/53 |
| 2006/0038968 A1 | 2/2006 | Kemper et al. |
| 2006/0077367 A1* | 4/2006 | Kobayashi et al. ............. 355/30 |
| 2006/0119809 A1 | 6/2006 | Verhagen et al. |
| 2006/0132731 A1 | 6/2006 | Jansen et al. |
| 2006/0158627 A1 | 7/2006 | Kemper et al. |
| 2006/0290909 A1 | 12/2006 | Donders et al. |
| 2007/0091287 A1* | 4/2007 | Chang et al. .................... 355/30 |
| 2007/0196566 A1 | 8/2007 | Takeishi et al. |
| 2007/0216881 A1 | 9/2007 | Van Der Schoot et al. |
| 2008/0002164 A1 | 1/2008 | Chang et al. |
| 2008/0018867 A1 | 1/2008 | Fujiwara et al. |
| 2008/0063987 A1 | 3/2008 | Ito |
| 2008/0271747 A1 | 11/2008 | De Jong et al. |
| 2008/0297744 A1 | 12/2008 | De Jong et al. |
| 2009/0027635 A1 | 1/2009 | De Jong et al. |
| 2009/0061331 A1 | 3/2009 | Nakano |
| 2009/0109413 A1 | 4/2009 | Shibazaki et al. |
| 2009/0225286 A1* | 9/2009 | Nagasaka et al. ............... 355/30 |
| 2009/0251672 A1* | 10/2009 | Nagasaka et al. ............... 355/30 |
| 2009/0316120 A1 | 12/2009 | Shiraishi et al. |
| 2010/0315609 A1 | 12/2010 | Fujiwara et al. |

FOREIGN PATENT DOCUMENTS

| | | | |
|---|---|---|---|
| EP | 1429188 A2 | * | 6/2004 |
| EP | 1 628 329 | | 2/2006 |
| EP | 1628163 A2 | | 2/2006 |
| EP | 2 034 515 | | 3/2009 |
| JP | 2007-220890 | | 8/2007 |
| JP | 2008-004928 | | 1/2008 |
| JP | 2008-010843 | | 1/2008 |
| JP | 2008-071891 | | 3/2008 |
| JP | 2008-294439 | | 12/2008 |
| JP | 2009-033111 | | 2/2009 |
| JP | 2009-260352 | | 11/2009 |
| KR | 2006-0009950 | | 2/2006 |
| KR | 10-2006-0036846 | | 5/2006 |
| WO | 99/49504 A1 | | 9/1999 |
| WO | 2005/064405 A2 | | 7/2005 |
| WO | WO 2005124833 A1 | * | 12/2005 |
| WO | 2006/062065 | | 6/2006 |

OTHER PUBLICATIONS

U.S. Appl. No. 12/237,583, filed Sep. 25, 2008, Van De Kerhof et al.
U.S. Appl. No. 12/314,611, filed Dec. 12, 2008, De Jong et al.
U.S. Appl. No. 12/289,621, filed Oct. 30, 2008, De Jong et al.
U.S. Appl. No. 12/358,000, filed Jan. 22, 2009, De Jong et al.
Japanese Office Action mailed Aug. 3, 2011 in corresponding Japanese Patent Application No. 2009-100474.
Korean Office Action mailed Jun. 27, 2012 in corresponding Korean Patent Application No. 10-2011-0043005.
Taiwan Office Action dated Apr. 29, 2013 in corresponding Taiwan Patent Application No. 098112350.

* cited by examiner

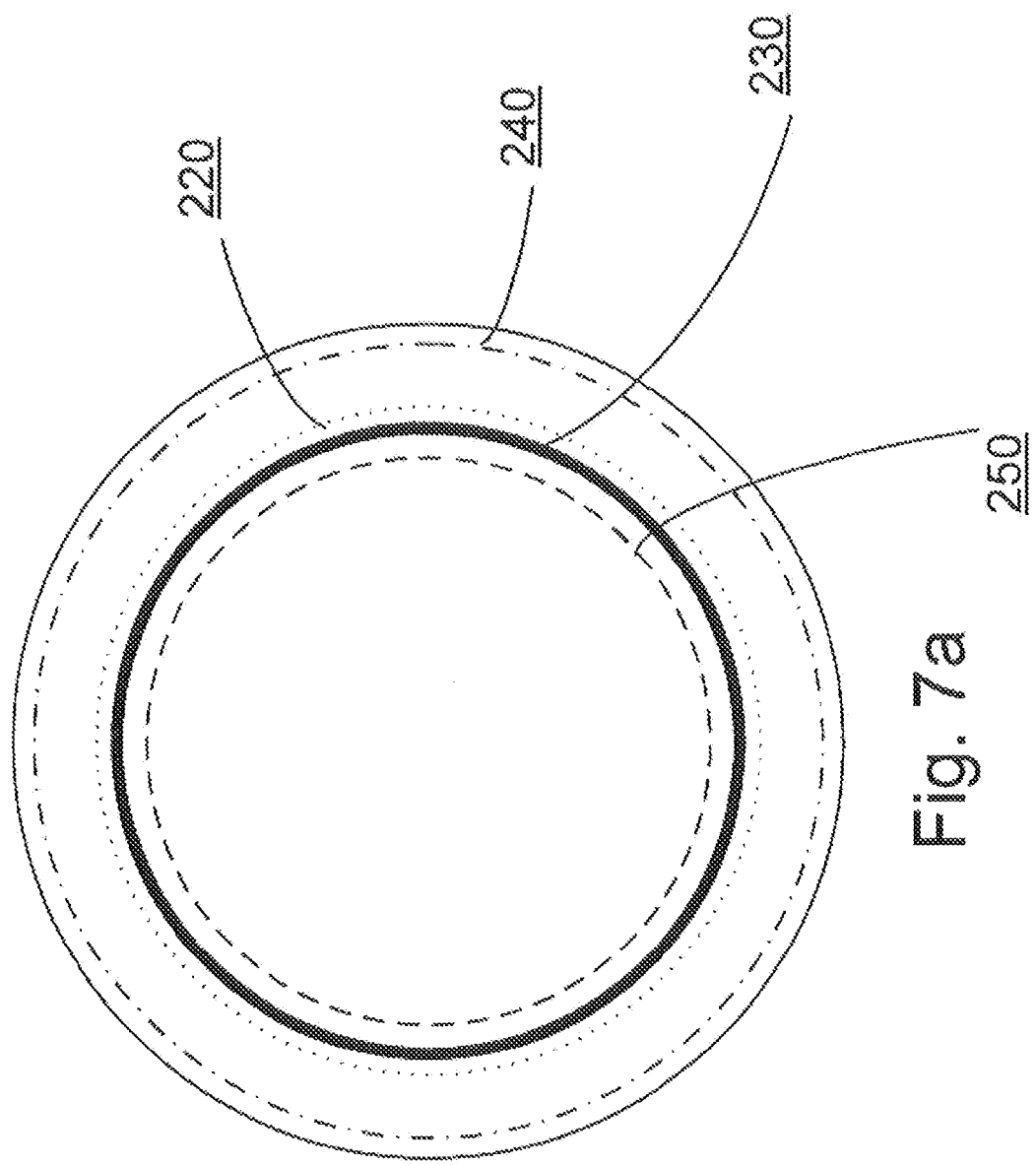

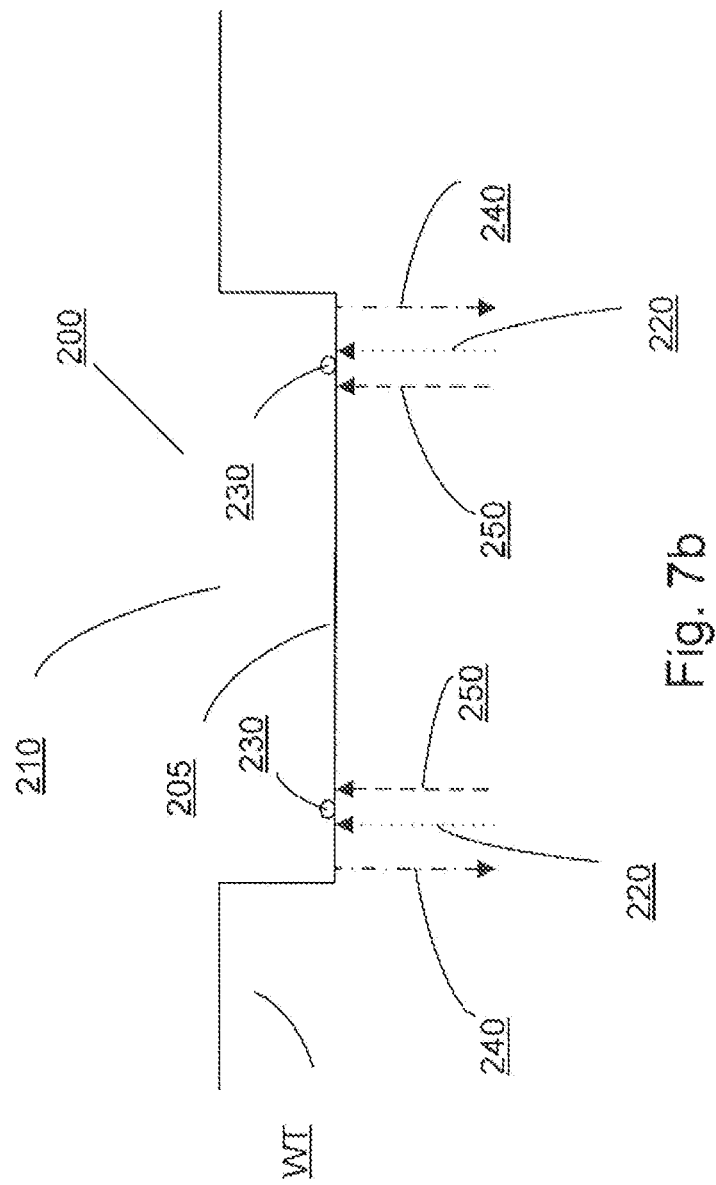

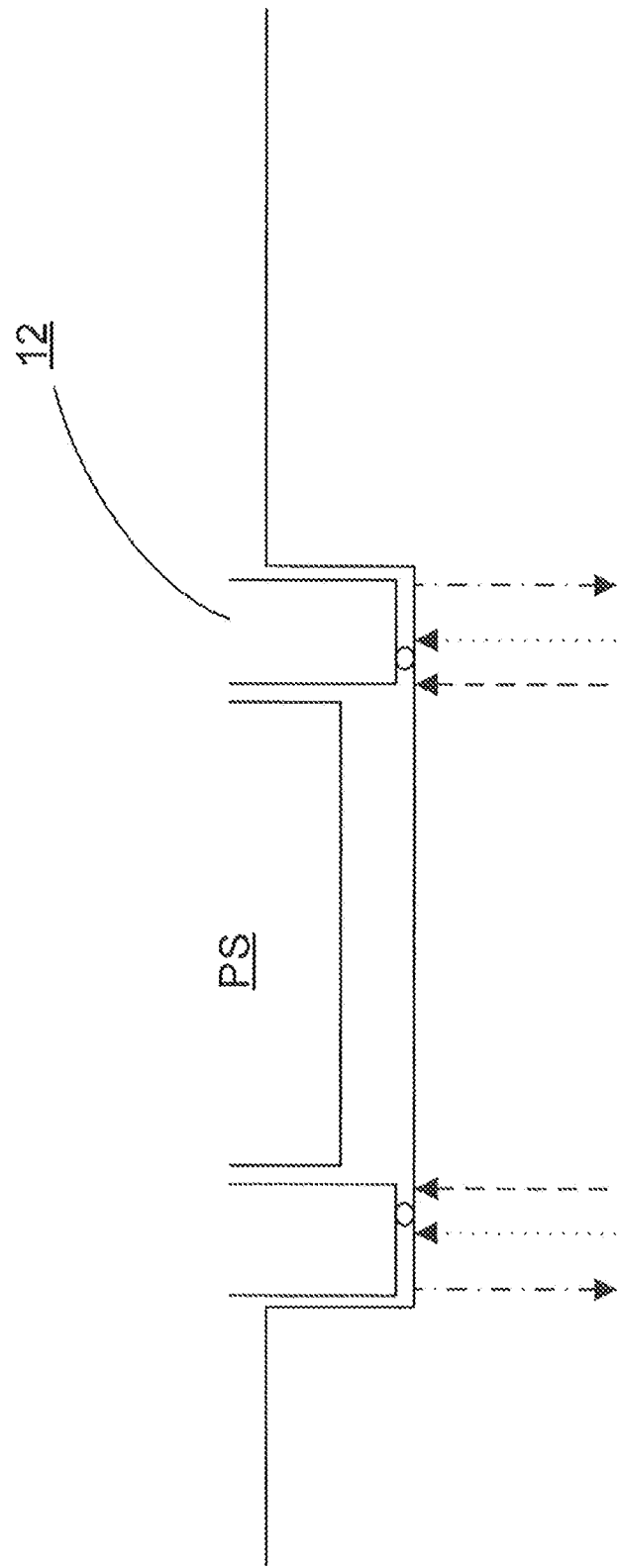

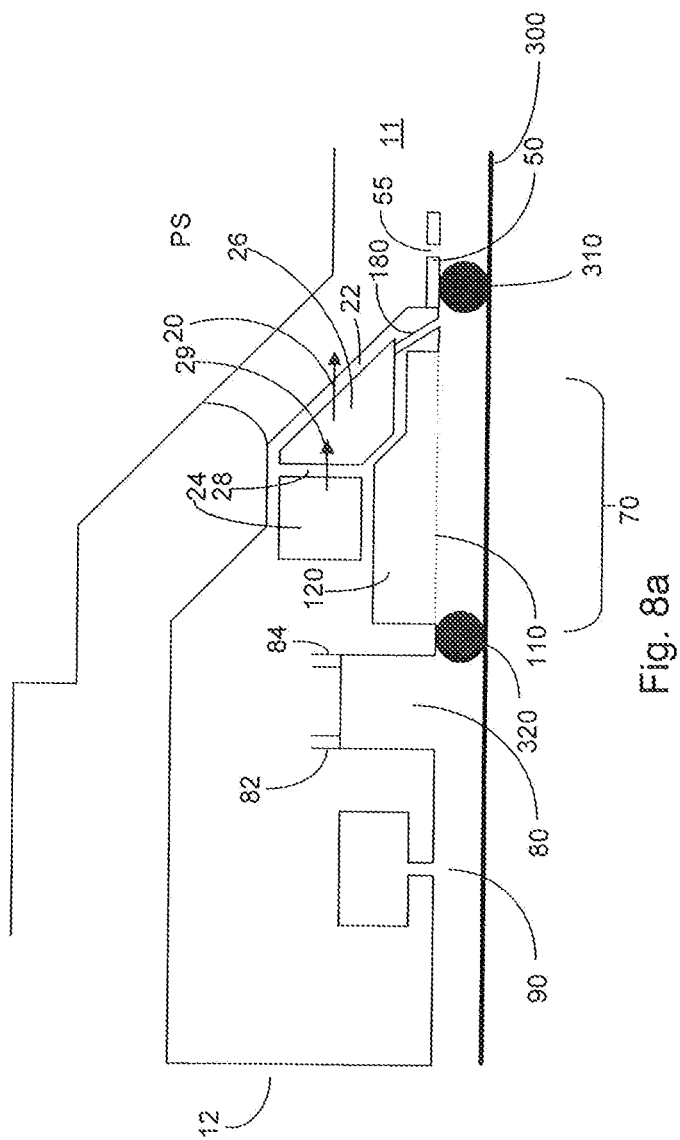

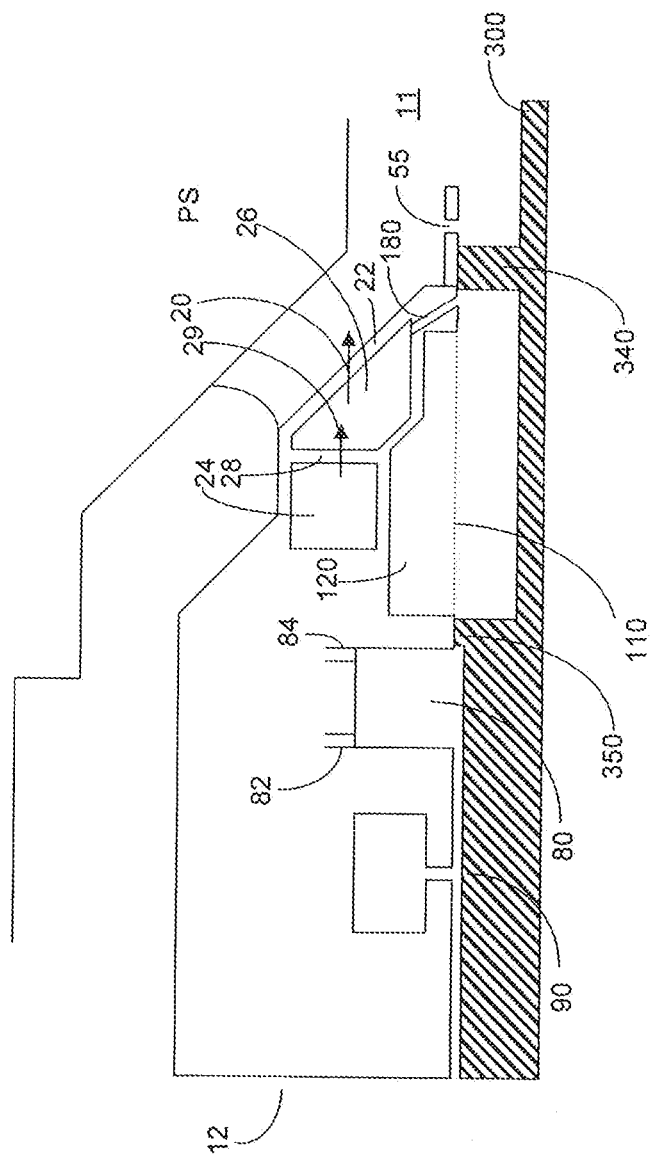

ic Apparatus and a
LITHOGRAPHIC APPARATUS AND A METHOD OF OPERATING THE APPARATUS This application claims priority and benefit under 35 U.S.C. §119(e) to U.S. Provisional Patent Application Ser. No. 61/071,361, entitled "Lithographic Apparatus and a Method of Operating the Apparatus", filed on Apr. 24, 2008, and to U.S. Provisional Patent Application Ser. No. 61/129,871, entitled "Lithographic Apparatus and a Method of Operating the Apparatus", filed on Jul. 25, 2008. The contents of those applications are incorporated herein in their entirety by reference.

FIELD

The present invention relates to an immersion lithographic apparatus and a method of operating the immersion lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT Patent Application Publication No. WO 99/49504. As illustrated in FIGS. 2 and 3, liquid is supplied by at least one inlet IN onto the substrate, preferably along the direction of movement of the substrate relative to the final element. Liquid is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States Patent Application Publication No. US 2004-0207824, hereby incorporated in its entirety by reference.

In European Patent Application Publication No. EP 1420300 and United States Patent Application Publication No. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States Patent Application Publication No. US 2006/0119809. A member is provided which covers the substrate W in all positions and which is arranged to have immersion liquid extending between it and the top surface of the substrate and/or substrate table which holds the substrate.

SUMMARY

One problem encountered with immersion lithographic machines is the occurrence of contaminating particles within the immersion system and on the surface of the substrate. The presence of a particle in the immersion system may cause a defect to occur during the exposure process, for example, if a particle is present between a projection system and a substrate being exposed. Contamination may deleteriously affect performance, for example, of a fluid containment system. It is therefore desirable to reduce the presence of particles in the immersion system. Thus a cleaning system in an immersion lithography is desirable. Cleaning can be problematical because of the incompatibility of certain cleaning fluids with lens and other optical coatings.

The presence of liquid on a substrate table will cause a thermal deviation. If such thermal deviation occurs regularly (for example the same path of the immersion system over the substrate table occurs) this can be anticipated and/or compensated for. However, unusual events which results in the liquid supply system spending more time than usual at a particular location (for example during cleaning or whilst waiting for the next substrate to be prepared) may lead to irregular thermal expansion/contraction effects of the substrate table. Such irregular expansion/contraction thermal contraction effects may lead to imaging defects, in particular to overlay errors.

It is desirable to provide a system for cleaning a part of an immersion lithography apparatus. Furthermore, it is desirable to provide a way of reducing or minimizing an error introduced due to prolonged positioning of a liquid supply system at a particular location with respect to a substrate table.

According to an aspect of the invention, there is provided an immersion lithographic apparatus comprising: an inlet for introducing cleaning fluid into a space, a surface to be cleaned at least in part defining the space; and a liquid seal for sealing around at least part of the space to hinder fluid surrounding the space from entering the space.

According to an aspect of the invention, there is provided an immersion lithographic apparatus, comprising: a substrate table for supporting a substrate; a fluid handling structure for providing liquid to a space between a projection system and the substrate and/or substrate table, wherein the substrate table comprises a thermally isolated area of a top surface which is thermally isolated from the remainder of the substrate table, the thermally isolated area being next to an edge of the substrate table which edge passes under the fluid handling structure during movement of the substrate table from under the projection system.

According to an aspect of the invention, there is provided an immersion lithographic apparatus comprising: a fluid handling structure for providing liquid to a space between a projection system and a substrate and/or substrate table; a cleaning station comprising a surface; an inlet for providing cleaning fluid between the fluid handling structure and the surface; and a seal radially inwardly of the inlet for sealing between the fluid handling structure and the surface to hinder passage of cleaning fluid to the projection system.

According to an aspect of the invention, there is provided a cleaning station for an immersion lithographic apparatus comprising a fluid handling structure for providing liquid to a space between a projection system and a substrate and/or substrate table, the cleaning station comprising: a surface; an inlet for providing cleaning fluid between the fluid handling structure and the surface; and a seal radially inwardly of the inlet for sealing between the fluid handling structure and the surface to hinder passage of cleaning fluid to the projection system.

According to an aspect of the invention, there is provided a device manufacturing method using an immersion lithographic apparatus, the method comprising introducing cleaning fluid into a space through an inlet, the space being defined at least in part by a surface to be cleaned; and sealing a liquid seal around at least part of the space to hindering fluid surrounding the space from entering the space.

According to an aspect of the invention, there is provided a device manufacturing method, the method comprising: supporting a substrate on a substrate table comprising a thermally isolated area; providing liquid from a fluid handling structure to a space between a projection system and the substrate and/or substrate table, the thermally isolated area being part of a top surface which is thermally isolated from the remainder of the substrate table; and passing the thermally isolated area under the fluid handling structure during movement of the substrate table from under the projection system, wherein the thermally isolated area is positioned next to an edge of the substrate table.

According to an aspect of the invention, there is provided a device manufacturing method, using an immersion lithographic apparatus, the method comprising: providing liquid from a fluid handling structure to a space between a projection system and a substrate and/or substrate table; providing cleaning fluid from an inlet to between the fluid handling structure and a surface of a cleaning station; and sealing between the fluid handling structure and the surface using a seal placed radially inwardly of the inlet, to hinder passage of cleaning fluid to the projection system.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 7A and 7B illustrate in plan and cross-section respectively a cleaning station on a substrate table;

FIG. 7C illustrates the cleaning station of FIG. 7B in use;

FIGS. 8A and 8B illustrate, in cross-section, embodiments of a cleaning station in use for cleaning an extractor of a barrier member 12;

DETAILED DESCRIPTION

Figure 1:
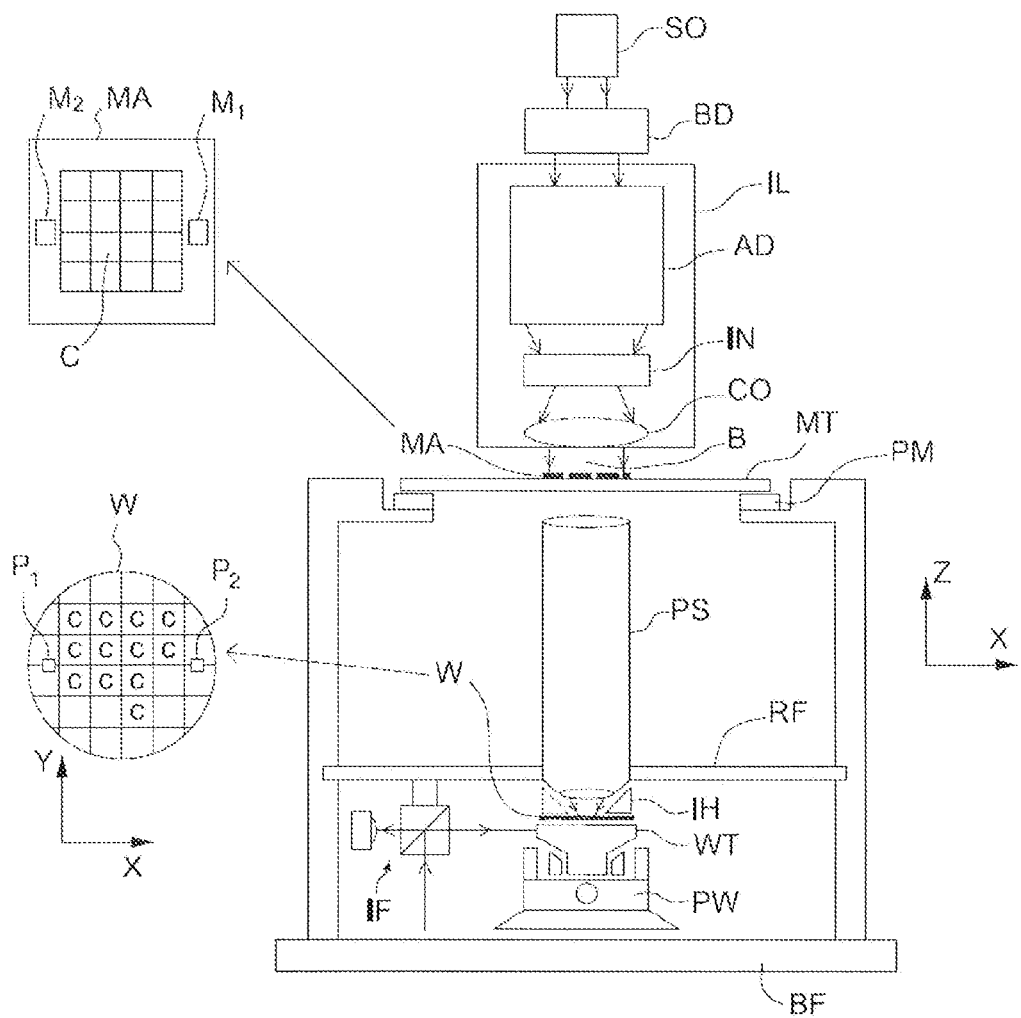
FIG. 1 depicts a lithographic apparatus according to an embodiment of the invention.
Figure 2:
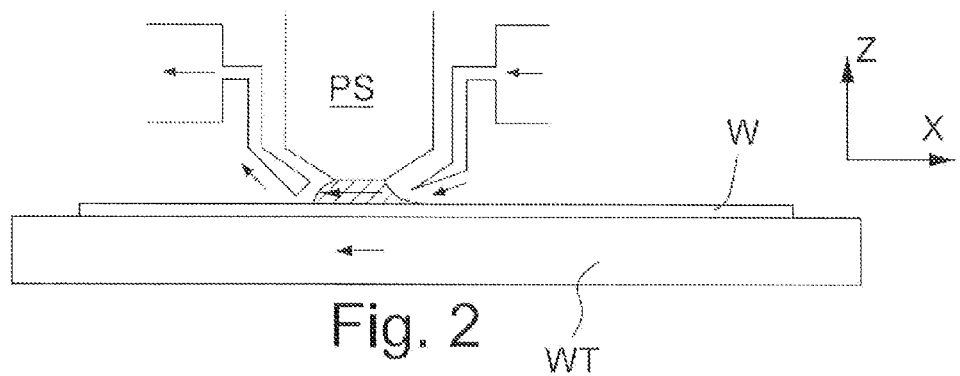
FIGS. 2 and 3 depict a fluid handling structure as a liquid supply system for use in a lithographic projection apparatus.
Figure 3:
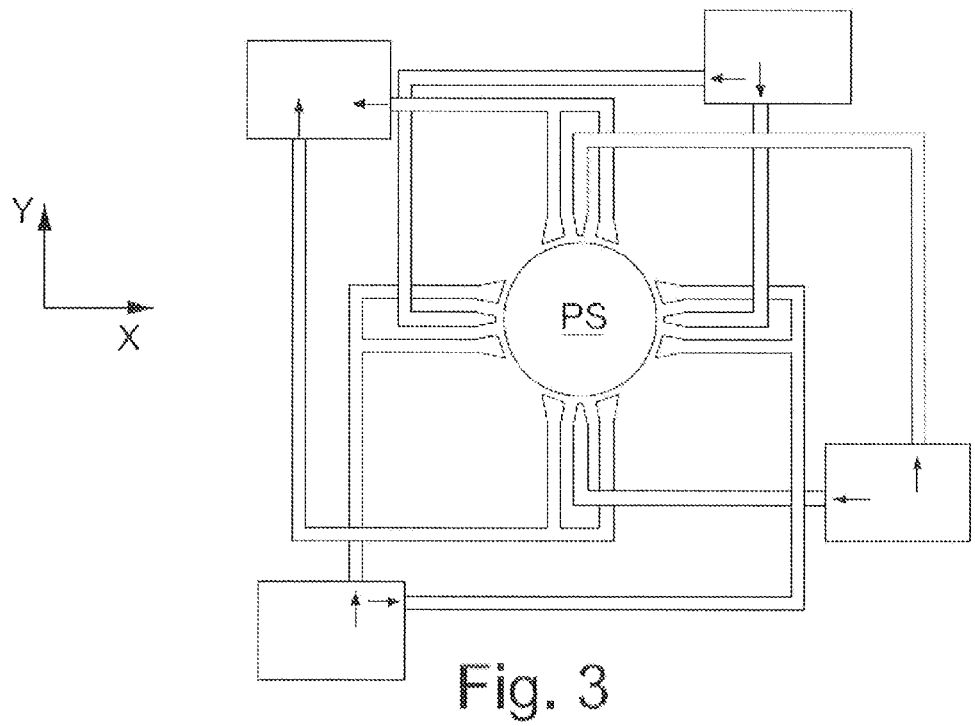
Figure 4:
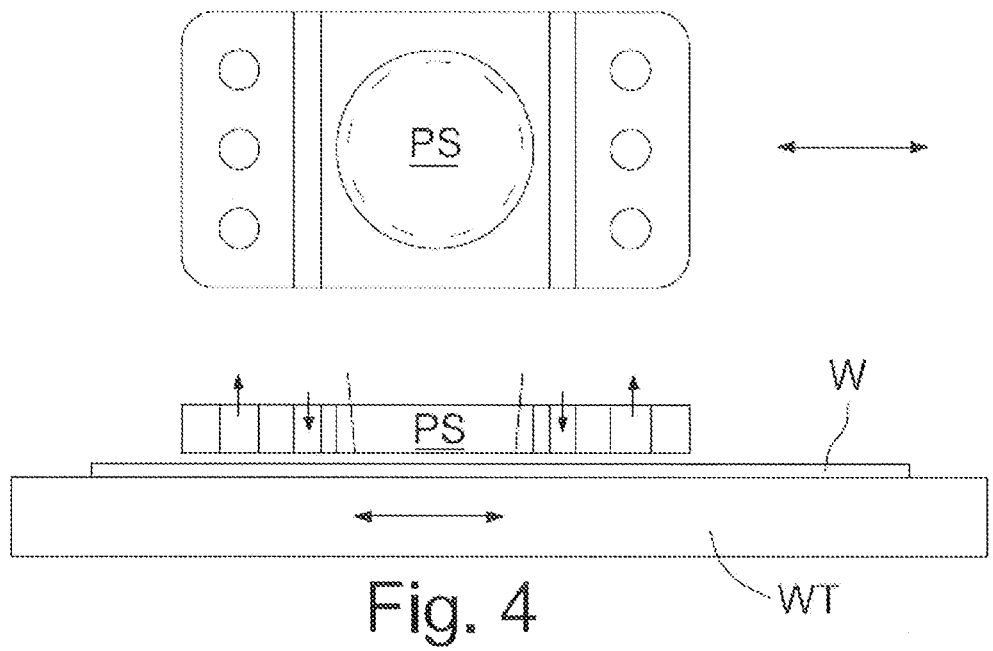
FIG. 4 depicts a further liquid supply system for use in a lithographic projection apparatus.

FIG. 1 schematically depicts a lithographic apparatus according to one embodiment of the invention. The apparatus comprises:
- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system. The types of projection system may include: refractive, reflective, catadioptric, magnetic, electromagnetic and electrostatic optical systems, or any combination thereof. The selection or combination of the projection system is as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS. The projection system focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

An arrangement for providing liquid between a final element of the projection system PS and the substrate is the so called localized immersion system. In this system a liquid handling system is used in which liquid is only provided to a localized area of the substrate. The space filled by liquid is smaller in plan than the top surface of the substrate and the area filled with liquid remains substantially stationary relative to the projection system PS while the substrate W moves underneath that area. Four different types of localized liquid supply systems are illustrated in FIGS. 2-5. The liquid supply systems disclosed in FIGS. 2-4 were described above.

Figure 5:
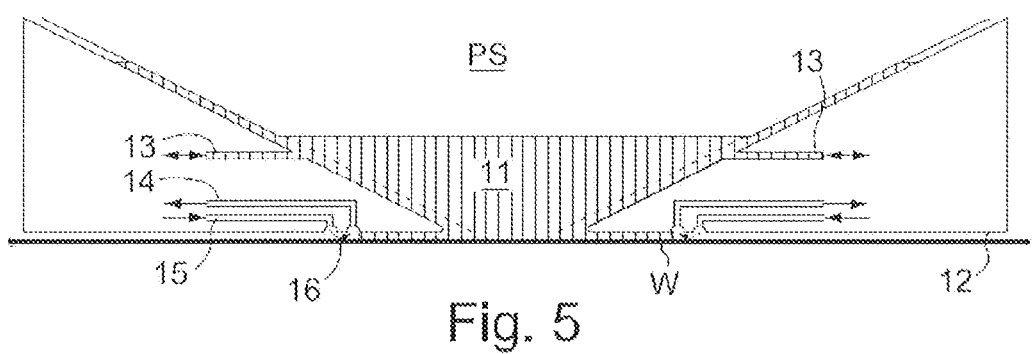
FIG. 5 depicts, in cross-section, a barrier member which may be used in an embodiment of the present invention as a liquid supply system.

FIG. 5 schematically depicts a localized liquid supply system with a barrier member 12. The barrier member extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The barrier member 12 is substantially stationary relative to the projection system in the XY plane though there may be some relative movement in the Z direction (in the direction of the optical axis). In an embodiment, a seal is formed between the barrier member and the surface of the substrate W and may be a contactless seal such as fluid seal, desirably a gas seal.

The barrier member 12 at least partly contains liquid in the space 11 between a final element of the projection system PL and the substrate W. A contactless seal 16 to the substrate W may be formed around the image field of the projection system so that liquid is confined within the space between the substrate W surface and the final element of the projection system PL. The space is at least partly formed by the barrier member 12 positioned below and surrounding the final element of the projection system PL. Liquid is brought into the space below the projection system and within the barrier member 12 by liquid inlet 13. The liquid may be removed by liquid outlet 13. The barrier member 12 may extend a little above the final element of the projection system. The liquid level rises above the final element so that a buffer of liquid is provided. In an embodiment, the barrier member 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the space 11 by a gas seal 16 which, during use, is formed between the bottom of the barrier member 12 and the surface of the substrate W. The gas seal is formed by gas, e.g. air or synthetic air but, in an embodiment, $N_2$ or another inert gas. The gas in the gas seal is provided under pressure via inlet 15 to the gap between barrier member 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the barrier member 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States Patent Application Publication No. US 2004-0207824.

Other arrangements are possible and, as will be clear from the description below, an embodiment of the present invention may use any type of localized liquid supply system as the liquid supply system.

One or more localized liquid supply systems seal between a part of the liquid supply system and a substrate W. The seal may be defined by a meniscus of liquid between the part of the liquid supply system and the substrate W. Relative movement of that part of the liquid supply system and the substrate W may lead to breakdown of the seal, for example the meniscus, and thereby leaking of liquid. The problem may be more significant at high scan velocities. An increased scan velocity is desirable because throughput increases.

Figure 6:
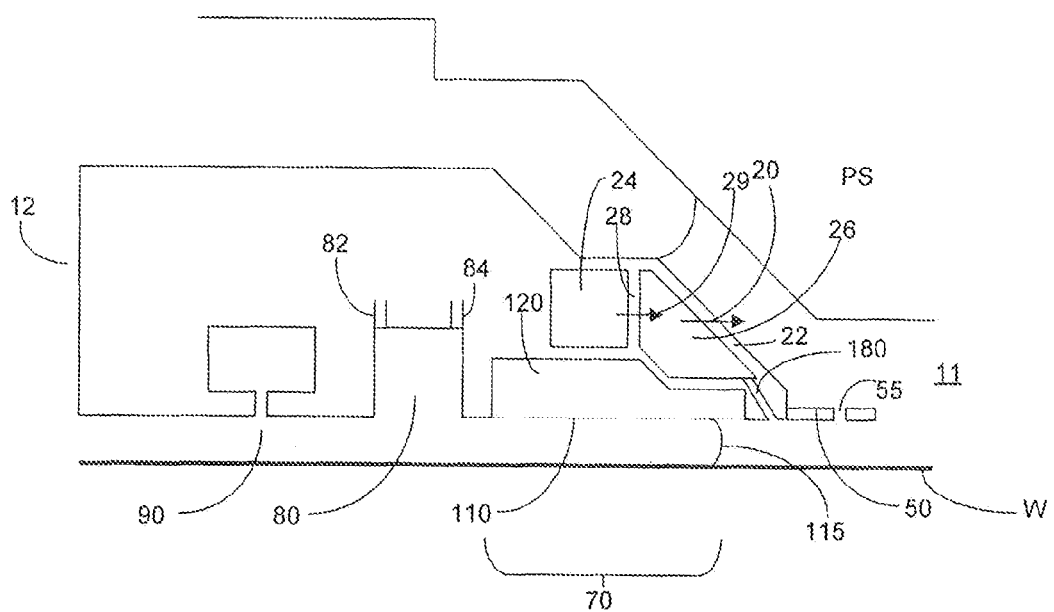
FIG. 6 illustrates, in cross-section, another barrier member which may be used in an embodiment of the present invention.

FIG. 6 illustrates a barrier member 12 which is part of a liquid supply system. The barrier member 12 extends around the periphery (e.g., circumference) of the final element of the projection system PS such that the barrier member (which is sometimes called a seal member) is, for example, substantially annular in overall shape. The projection system PS may not be circular and the outer edge of the barrier member 12 may also not be circular so that it is not necessary for the barrier member to be ring shaped. The barrier could also be other shapes so long as it has an opening through which the projection beam may pass out from the final element of the projection system PS. The opening may be centrally located. Thus, during exposure, the projection beam may pass through liquid contained in the opening of the barrier member and onto the substrate W. The barrier member 12 may be, for example, substantially rectangular and may not be necessarily the same shape as the final element of the projection system PS is at the height of the barrier member 12.

The function of the barrier member 12 is at least partly to maintain or confine liquid in the space between the projection system PS and the substrate W so that the projection beam may pass through the liquid. The top level of liquid is simply contained by the presence of the barrier member 12. The level of liquid in the space is maintained such that the liquid does not overflow over the top of the barrier member 12.

The immersion liquid is provided to the space 11 by the barrier member 12 (thus the barrier member may be considered to be a fluid handling structure). A passageway or flow path for immersion liquid passes through the barrier member 12. Part of the flow path is comprised by a chamber 26. The chamber 26 has two side walls 28, 22. Liquid passes through the first side wall 28 into chamber 26 and then through the second side wall 22 into the space 11. A plurality of outlets 20 provide the liquid to the space 11. The liquid passes through holes 29, 20 in plates 28, 22 respectively prior to entering the space 11. The location of the through holes 20, 29 may be random.

A seal is provided between the bottom of the barrier member 12 and the substrate W (This feature indicates that the barrier member may be a fluid handling structure). In FIG. 6 a seal device is configured to provide a contactless seal and is made up of several components. Radially outwardly from the optical axis of the projection system PS, there is provided a (optional) flow plate 50 which extends into the space (though not into the path of the projection beam) which helps maintain substantially parallel flow of the immersion liquid out of outlet 20 across the space. The flow control plate has through holes 55 in it to reduce the resistance to movement in the direction of the optical axis of the barrier member 12 relative to the projection system PS and/or substrate W.

Radially outwardly of the flow control plate 50 on the bottom surface of the barrier member 12 may be an inlet 180. The inlet 180 can provide liquid in a direction towards the substrate. During imaging this may be useful in preventing bubble formation in the immersion liquid by filling a gap between the substrate W and substrate table WT with liquid.

Radially outwardly of the inlet 180 may be an extractor assembly 70 to extract liquid from between the barrier member 12 and the substrate W and/or the substrate table WT. The extractor 70 will be described in more detail below and forms part of the contactless seal which is created between the barrier member 12 and the substrate W. The extractor may operate as a single phase or as a dual phase extractor.

Radially outwardly of the extractor assembly 70 may be a recess 80. The recess is connected through an inlet 82 to the atmosphere. The recess is connected via an outlet 84 to a low pressure source. The inlet 82 may radially outwardly positioned with respect to the outlet 84. Radially outwardly of the recess 80 may be a gas knife 90. An arrangement of the extractor, recess and gas knife is disclosed in detail in United States Patent Application Publication No. US 2006/0158627. However, in that document the arrangement of the extractor assembly is different.

The extractor assembly 70 comprises a liquid removal device or extractor or inlet such as the one disclosed in United States Patent Application Publication No. US 2006-0038968, incorporated herein its entirety by reference. Any type of liquid extractor may be used. In an embodiment, the liquid removal device 70 comprises an inlet which is covered in a porous material 110 which is used to separate liquid from gas to enable single-liquid phase liquid extraction. A chamber 120 downstream of the porous material 110 is maintained at a slight under pressure and is filled with liquid. The under pressure in the chamber 120 is such that the meniscuses formed in the holes of the porous material prevent ambient gas from being drawn into the chamber 120 of the liquid removal device 70. However, when the porous surface 110 comes into contact with liquid there is no meniscus to restrict flow and the liquid can flow freely into the chamber 120 of the liquid removal device 70. The porous surface 110 extends radially inwardly along the barrier member 12 (as well as around the space). The rate of extraction through the porous surface 110 varies according to how much of the porous material 110 is covered by liquid.

The porous material 110 has a large number of small holes each with a dimension, e.g. a width, such as a diameter, $d_{hole}$ in the range of 5 to 50 μm. The porous material may be maintained at a height in the range of 50 to 300 μm above a surface from which liquid is to be removed, e.g. the surface of a substrate W. In an embodiment, porous material 110 is at least slightly hydrophilic, i.e. having a contact angle of less than 90°, desirably less than 85° or desirably less than 80°, to the immersion liquid, e.g. water.

It may not always be possible to prevent gas being drawn into the liquid removal device but the porous material 110 will prevent large uneven flows that may cause vibration. Microsieves made by electroforming, photoetching and/or laser cutting can be used as the porous material 110. Suitable sieves are made by Stork Veco B.V., of Eerbeek, the Netherlands. Other porous plates or solid blocks of porous material may also be used, provided the pore size is suitable to maintain a meniscus with the pressure differential that will be experienced in use.

During scanning of the substrate W (during which the substrate moves under the barrier member 12 and projection system PS) the meniscus 115 extending between the substrate W and the barrier member 12 may be drawn either towards or away from the optical axis by a drag force applied by the moving substrate. This can lead to liquid loss which may result in: evaporation of the liquid, cooling of the substrate, and consequent shrinkage and overlay errors as described above. Liquid stains may also or alternatively be left behind from interaction between the liquid droplets and resist photochemistry.

Although not specifically illustrated in FIG. 6, the liquid supply system has an arrangement to deal with variations in the level of the liquid. This is so that liquid which builds up between the projection system PS and the barrier member 12 can be dealt with and does not spill. Such a build-up of liquid might occur during relative movement of the barrier member 12 to a projection system PS described below. One way of dealing with this liquid is to provide the barrier member 12 so that it is very large so that there is hardly any pressure gradient over the periphery (e.g., circumference) of the barrier member 12 during movement of the barrier member 12 relative to the projection system PS. In an alternative or additional arrangement, liquid may be removed from the top of the barrier member 12 using, for example, an extractor such as a single phase extractor similar to the extractor 70. An alternative or additional feature is a liquidphobic or hydrophobic coating. The coating may form a band around the top of the barrier member 12 surrounding the opening and/or around the last optical element of the projection system PS. The coating may be radially outward of the optical axis of the projection system. The liquidphobic or hydrophobic coating helps keep the immersion liquid in the space.

In, for example, an apparatus in which two substrate tables or stages are provided in which each one carries a substrate, there exists a difficulty during swap of one substrate table from underneath the projection system to another substrate table underneath the projection system. This is because if the liquid from the liquid supply system is removed prior to swapping the tables then a drying stain may appear on the final element of the projection system. A possible solution to this problem which has been proposed is to provide a shutter member, such as a dummy substrate, which is positionable under the projection system during swapping of substrate tables. In this way the liquid supply system can be kept on during swap of substrates and no drying stains can form. Such a dummy substrate is described, for example, in European Patent Application Publication No. EP-1,420,299. In another form of shutter member, the second substrate table is brought close to the first substrate table. The two substrate tables are moved simultaneously under the projection system. If the gap between the two substrate tables is small (or at least has a drain underneath it) liquid loss should be minimal. In some instances the substrate table WT has its top surface extended by a protrusion which may be rotatable or retractable, as in the form of a drawbridge. Such a arrangement is disclosed in United States Patent Application Publication No. US 2007-0216881. In a variation of this form of shutter member, the second table is not a second substrate table, but its surface functions as a shutter member during substrate swap. Such a table may used for measuring and may be called a measuring table. The first or second substrate table is moved back under the projection system when a substrate is available, for example, for exposure. As will be appreciated, the shutter member may in addition or alternatively used in a single substrate table apparatus in order to keep the projection system PS in contact with liquid during, for example, substrate swap on the substrate table.

A difficulty with liquid handling systems such as those of FIGS. 5 and 6 is that the immersion system, especially the underside of the barrier member 12, may become contaminated. This may lead to a change in surface contact angle (increase) of the immersion liquid to the surface of the porous member 110 and/or blocking of holes in the porous member 110. A change from liquidphilic to liquidphobic nature of the porous member may lead to a loss in performance of the extractor 70. For example, more gas than usual may be extracted. If the performance of the extractor 70 is reduced, then liquid may leak from the space 11 and be left behind on the substrate surface. This is undesirable. Additionally or alternatively, contamination may be left behind on the top surface of the substrate W or the top surface of the substrate table WT. This is also undesirable as such contamination can find its way into the immersion liquid. Below several ways in which this type of contamination can be cleaned are described.

Particle contamination may include platelets, globules, and/or filaments. Normally this particle contamination is photo resist and/or top coat material.

Further examples of how a single phase extractors can be used in an immersion hood or liquid confinement system or liquid supply system can be found, for example in European Patent Application Publication No. EP 1,628,163 and United States Patent Application Publication No. US 2006-0158627. In most applications the porous member will be on an underside of the liquid supply system and the maximum speed at which the substrate W can move under the projection system PS is at least in part determined by the efficiency of removal of liquid through the porous member 110.

A single phase extractor may also be used in a two phase mode in which both liquid and gas are extracted (say, for example, 50% gas, 50% liquid). The term single phase extractor is not intended herein to be interpreted only as an extractor which extracts one phase, but more generally as an extractor which incorporates a porous member through which gas and/or liquid is/are extracted. In an embodiment of the gas knife (i.e. the gas supply ring 33) may be absent.

The above mentioned single phase extractor can be used in a liquid supply system which supplies liquid to only a localized area of the top surface of the substrate. Furthermore, such an extractor may be used in other types of immersion apparatus. The extractor may be used for an immersion liquid other than water. The extractor may be used in a so-called "leaky seal" liquid supply system. In such a liquid supply system liquid is provided to the space between the final element of the projection system and the substrate. That liquid is allowed to leak from that space radially outwardly. For example, an immersion hood or liquid confinement system or liquid supply system is used which does not form a seal between itself and the top surface of the substrate or substrate table, as the case may be. The immersion liquid may only be retrieved radially outwardly of the substrate in a "leaky seal" apparatus. The comments made in relation to a single phase extractor may apply to other types of extractor, for example, an extractor without a porous member. Such an extractor may be used as a two phase extractor for extracting both liquid and gas.

An embodiment of the present invention will be described below in relation to an immersion system optimized for supplying an immersion liquid. However, an embodiment of the present invention is equally applicable for use with an immersion system that uses a fluid supply system supplying a fluid other than a liquid as the immersion medium.

An embodiment of the present invention is directed, in particular, to in-line cleaning. That is, the cleaning takes place in the lithographic projection apparatus. Desirably the cleaning can take place between the imaging of two substrates or between the imaging of a first batch of substrates and a second batch of substrates. This is more time efficient than if cleaning needs to be performed off-line. However, an embodiment of the invention may be applied in an off-line arrangement.

A difficulty with in-line cleaning is that a solvent which is suitable for cleaning of a component may damage another component. For instance, a solvent which is good for cleaning the underside of the liquid handling system, and in particular the extractor 70, may be deleterious for the projection system PS. For example, propylene glycol methyl ether acetate (PGMEA) is particularly suitable for cleaning organic matter from the extractor. However, a side seal and coating which may be applied to the projection system PS in order to make the projection system compatible with immersion liquid could be sensitive to contact with PGMEA.

A first embodiment of the present invention is illustrated in FIGS. 7A-C. A cleaning station 200 is provided. The cleaning station comprises a surface 205. In an embodiment, the surface 205 is formed in a recess 210 in a main surface. The main surface may be the top surface of the substrate table WT. Providing the surface 205 in a recess 210 is advantageous because the risk of spilling of a cleaning fluid onto another component is reduced.

The surface 205 is provided with an inlet 220 for providing cleaning fluid to the surface to be cleaned. In an embodiment, the surface to be cleaned is part of the underside of the barrier member 12 of the liquid handling system as illustrated in FIG. 7C. Thus, the inlet 220 provides cleaning fluid between the liquid handling system and the surface 205. The recess is shaped to receive the undersurface of the barrier member 12. In use, the barrier member 12 is arranged around the optical axis of the projection system PS. Thus, the following description of the cleaning station 200 is described with respect to the optical axis of the projection system PS. However, the cleaning station may be otherwise configured and constructed to clean a surface of a differently shaped component, which may not be radially arranged.

A seal 230 is positioned radially inwardly of the inlet 220 with respect to the optical axis. The seal 230 is for sealing radially inwardly of the inlet 220 between the surface 205 and the surface to be cleaned, e.g., barrier member 12. The seal 230 seals between an inner edge of a bottom surface of the barrier member 12 and the extractor 70. The seal 230 thereby prevents cleaning fluid from leaking radially inwardly past the seal 230. As can be seen in FIG. 7C this means that cleaning fluid is prevented from reaching the projection system PS.

Radially outwardly of the inlet 220 in the surface 205 is defined an outlet 240. The outlet 240 is in the surface 205 for the removal of cleaning fluid from the surface 205. Therefore, there will be a radially outward flow of cleaning fluid from the inlet 220 to the outlet 240. This is desirably so that the flow of cleaning liquid is away from the projection system PS. Optionally there may be a further seal radially outwardly of the outlet 240. The further seal would be similar to the seal 230.

The seal 230 may be in the form of a ring, such as an annular ring or an O-ring. Alternatively or additionally, the seal 230 could be in the form of a projection from the surface 205. In the latter case it may be desirable to provide a feature on the undersurface of the surface to be cleaned, e.g., the barrier member 12, to form a seal against the projection. For example, the projection could rest against an outlet of underpressure source of the barrier member 12. The outlet of the underpressure source may be a component which is already present on the bottom surface of the barrier member 12 or may be a port which is provided for just this purpose.

As can be seen in FIG. 7A, which is a plan view of the cross-sectional view of FIG. 7B, the inlet 220, outlet 240 and seal 230 are all annular and in particular circular. Other shapes may be possible. The shape is such that it may match the shape in plan, of the surface to be cleaned, e.g., a liquid handling system.

If the liquid handling system of FIG. 6 is being cleaned by the embodiment of FIG. 7, the seal 230 would abut up against the underside of the barrier member 12 radially inwardly of the porous member 110. For example, the seal 230 could abut up onto the flow control plate 50 radially outwardly of the through hole 55.

As is illustrated most clearly in FIG. 7B, a further inlet 250 is provided radially inwardly of the seal 230. The further inlet 250 could provide a fluid to the space bounded by the projection system PS. The fluid could be provided at an overpressure. An overpressure helps in maintaining the integrity of the seal 230. The second inlet 250 could, for example, provide a gas into the space beneath the projection system PS.

Although the inlets and outlets in FIGS. 7A-C are illustrated as being continuous, this is not necessarily the case. Each inlet and outlet may be continuous or discontinuous, for example, in the form of a plurality of discrete inlets/outlets. The discontinuous arrangement may be such that the inlet or outlet matches the shape in plan, of a feature of the surface to be cleaned, e.g., the liquid handling system.

As will be appreciated, if the cleaning station 200 is provided in a recess 210, some movement in the Z direction (the direction of the optical axis of the projection system PS) may be required in order to engage the bottom of the surface to be cleaned, e.g., the liquid handling system, with the seal 230. This movement in the Z direction can be accomplished by movement of the substrate table WT upwards or by movement of the surface to be cleaned, e.g., the barrier member 12, downwards. In an embodiment, the top surface of the seal 230 is level with or below the top surface of the table WT. This can help prevent accidental collision.

A controller or software may be provided for controlling the apparatus during cleaning. For example, the controller or software can deal with the movement in the Z direction and control the flow of fluid through the inlet(s) and outlet in the surface 205.

As will be appreciated, it is possible for some or all of the inlets 220, 250 and outlet 240 to be positioned in the surface to be cleaned, e.g., liquid handling system, itself rather than in the surface 205. In that case the inlet(s) and outlet may have other functions, for example during imaging. Alternatively or additionally, an inlet(s) or outlet(s) may be operative only during cleaning.

FIGS. 8A and 8B illustrate further embodiments which are the same as the embodiment of FIG. 7 except as described below. As will be appreciated, in order to use the cleaning station 200 of FIG. 7, the substrate table WT should be stationary under the projection system PS. This could be deleterious in terms of reduction in throughput of the apparatus as a whole. As described above, during substrate swap a moveable shutter member, such as a dummy substrate, is sometimes attached to the bottom of the liquid handling system in order that a flow of fluid may be maintained across the space 11 thereby to avoid a drying stain on the final element of the projection system PS. In the embodiment of FIGS. 8A and 8B a dummy substrate 300 has been modified in order to allow cleaning of the underside of the liquid handling system (and in particular of the porous member 110 of the extractor 70). This may occur during substrate swap while a substrate is being exchanged for example, by the first substrate table being swapped for a second substrate table under the projection system PS. In another embodiment, the shutter member may be held underneath the projection system, while a substrate is replaced by another substrate.

As can be seen in FIG. 8A a dummy substrate 300 is attached to the liquid handling system or barrier member 12 as usual during substrate swap. This can be done by an attachment mechanism for example using electromagnetism or, more usually, by creating an underpressure between the dummy substrate 300 and the bottom of the barrier member 12. This may be done by turning off the gas knife 90 and applying an underpressure to outlet 84. Any other means of attaching the dummy substrate 300 to the underside of the barrier member may be employed.

Two seals 310, 320 are provided on the dummy substrate 300. These seals seal either side of the porous member 110. Cleaning fluid may then be introduced in the gap between the porous member 110, the seals 310, 320 and the dummy substrate 300. The seals 310, 320 may be provided either side of another feature 80, 90 on the undersurface of the barrier member 12. The seals may be provided so that the gap into which the cleaning fluid may be introduced is defined in part by the undersurface of the barrier member 12 in which two or more features 70, 80, 110 are located. Substantially the entire undersurface of the barrier member 12 may define the surface of the gap.

The cleaning fluid may be introduced, for example, through the inlet 180 in the bottom surface of the barrier member 12. In this case, the inner seal 310 will need to be positioned radially inwardly of that inlet 180. The inlet 180 may be provided only for use during a cleaning operation. Alternatively the cleaning fluid could be provided through an inlet in the dummy substrate 300.

Thus, a flow of cleaning fluid is provided out of the inlet 180, into the space between the liquid handling system and the dummy substrate W bounded by the seals 310, 310 and out through the porous member 110. In this way the bottom surface of the porous member 110 can be cleaned. Advantageously this cleaning can occur while, for example, a first substrate table is being swapped for a second substrate table under the projection system. Any heat load introduced by the cleaning operation may be isolated to the dummy substrate 300 rather than the substrate table. If the dummy substrate 300 is mounted on a thermally isolated island or area of the substrate table WT, this is advantageous because it can prevent a thermal load being applied to the substrate table WT after the dummy substrate 300 is placed back on the substrate table WT. An embodiment of a thermally isolated island will be described in more detail with reference to FIG. 11.

In the embodiment of FIG. 8A, the two seals 310, 320 are illustrated as being O-ring type seals. However a different type of seal may be possible. In the embodiment of FIG. 8B, projections 340, 350 are provided on the substrate 300 and these projections act as seals.

The embodiment of FIG. 8B works in the same way as the embodiment of FIG. 8A. The difference is that the seals 310, 320 of FIG. 8A which are applied to the dummy substrate 300 are replaced by variations in the surface profile of the dummy substrate 300 in the FIG. 8B embodiment. As with the FIG. 8A embodiment, the cleaning fluid could be provided through an inlet in the dummy substrate 300. The projections 340, 350 may be located relative to the barrier member 12 so that one of more features 80, 90, 110 of the barrier member, or the entire undersurface of the barrier member 12, may be located in the part of the undersurface of the barrier member 12 which defines the gap. One or more features 80, 90, 110 may be between projections 340, 350 on the barrier member 12.

As can be seen from FIG. 8B, the gap between the porous member 110 and the top surface of the dummy substrate 300 is larger than the gap between the bottom surface of the liquid handling system and the top surface of the dummy substrate 300 radially outwardly of the seal 350. For example, the first gap could be of the order of 500 to 50 μm, desirably 150 μm, whereas the second gap could be of the order of 20 μm or less. This is done so that there is space for a large fluid flow under the porous member 110 during cleaning. For example, a fluid flow of about between 0.1 and 1 liter per minute is possible. On the other hand, having a small gap under the recess 80 means that a smaller underpressure can be applied to the outlet 84 than would otherwise be necessary in order to hold the dummy substrate 300 up against the liquid handling system.

In both cases of FIGS. 8A and 8B, the seals 310, 320, 340, 350 may be of the order of 1 mm wide.

Of course it will be appreciated that the dummy substrate 300 of FIGS. 8A and 8B could actually be formed on the substrate table WT and thereby not be removable from the substrate table WT, as is the case with a dummy substrate. In that case the cleaning mechanism would work in the same way. However, it may not be necessary to control the gas knife 90 and recess 80 in the same way because an attractive force between the liquid handling system and the dummy substrate 300 may no longer be necessary. Particularly in this embodiment, the cleaning fluid may be provided through an inlet in the substrate table WT, positioned between the two seals 310, 320, 340, 350. As with the embodiment of FIG. 7, a controller or software may be provided to operate the cleaning station in the manner described above.

In the embodiments of FIGS. 8A and 8B, if the cleaning fluid used is not harmful to the projection system PS, the radially most inward seal 310, 340, may be absent. In that case the cleaning fluid may be provided through holes 20 rather than inlet 180. As will be appreciated, in this arrangement the inlet 180 may not be present in the liquid handling system. This may be desirable for cleaning other parts of the immersion system, for example, the radially inwardly directed surfaces of the barrier member 12 and the surface of the final optical element of the projection system PS.

In both embodiments it is possible to provide immersion liquid through inlets 20 at the same time as performing cleaning. Thus, the function of the dummy substrate 300 in maintaining the final element of a projection system wet during substrate swap may be preserved.

As with the embodiment of FIG. 7, it is possible provide a small pressure difference between locations radially inwardly and radially outwardly of the inner seal 310, 340, to improve the performance of that seal. This can be achieved, for example, by putting the area between seals 310 and 320 at an underpressure compared to the area beneath the projection system PS. Alternatively or additionally an overpressure may be generated in the area under the projection system PS. This could be achieved, for example, with use of a resilient member between the barrier member 12 and the projection system PS as described in U.S. patent application no. U.S. 60/996, 654, filed 28 Nov. 2007. In all of the above embodiments the flow of cleaning fluid is controlled by use of a valve. If an inlet serves a dual purpose, then a switching valve may be present.

The embodiments of FIGS. 7 and 8 may be used with any cleaning fluid. Cleaning fluid includes ultra-pure water, a soap, a cleaning solvent and/or agent such as PGMEA, at a concentration of at least greater than 0.1%. PGMEA is desirably used at a concentration of about 100%. If PGMEA is mixed with water this may undesirably lead to foaming. Following cleaning, rinsing may be necessary to remove the cleaning agent. For example, it may be necessary to rinse until a concentration of less than 1 part per billion of the cleaning agent is present. A typical soap could be TLDR-A001 or TLDR-A001-C4, which are manufactured by Tokyo Ohka Koyo Co., Ltd. Although such a solvent can be prone to foaming, it is compatible with the liquidphobic (e.g., hydrophobic) coating used on the projection system PS. The cleaning fluid could be a mixture of a soap and a solvent.

Figure 9:
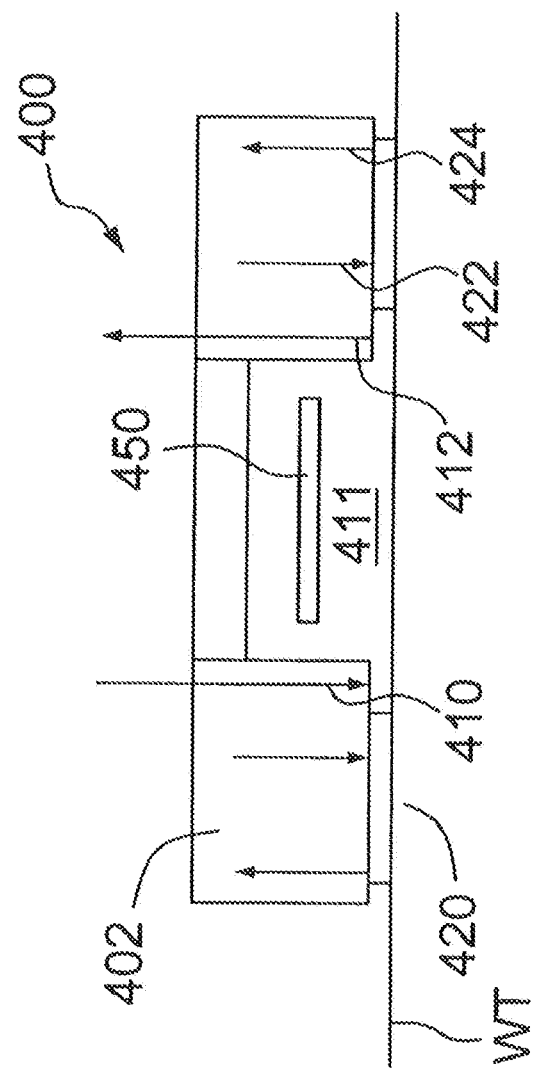
FIG. 9 illustrates, in cross-section, an embodiment of a cleaning station optimized to avoid foaming of cleaning fluid.

FIG. 9 illustrates a cleaning station 400 which is designed for use with a cleaning solvent which otherwise suffers from foaming. PGMEA is an organic solvent which can suffer from foaming difficulties. Foaming difficulties tend to occur at an interface between a cleaning solvent and a fluid, particularly gas. Therefore, in the embodiment of FIG. 9 an inlet 410 is provided to provide a cleaning solvent to a space 411. In order to seal the space 411 from contact with a surrounding fluid a liquid seal 420 is provided to seal around at least part of the space 411. The surrounding fluid may be a liquid and/or gas, particularly a gas atmosphere. In this way contact of the cleaning fluid in the space 411 with gas surrounding the surface to be cleaned is avoided. The seal 420 can extend across a gap of between 100 and 250 µm.

The embodiment of FIG. 9 illustrates how a cleaning station 400 can clean a top surface of a substrate table WT. The following description is a radial configuration. However, this is intended to facilitate the ease of description and is not intended to be limiting. The description may apply to any type of arrangement of cleaning station which operates in a similar manner as that described, irrespective as to whether it has a radial configuration.

A member 402 is provided which is movable relative to the surface of the substrate table WT so that all of the top surface of the substrate table WT may be cleaned. The member is provided with an inlet 410 which provides liquid to a space 411 between the member 402 and the substrate table WT. An outlet 412 is provided on the other side of space 411 to remove cleaning fluid from the space 411. Thus a flow of cleaning fluid from the inlet 410 to the outlet 412 can be achieved. Radially outwardly of the inlet and outlet is the liquid seal 420. The liquid seal comprises an inlet 422 and an outlet 424. The outlet 424 may be positioned radially outwardly of the inlet 422 relative to the space 411. However, radial positions of the outlet 424 and the inlet 422 may be exchanged. A liquid flow from the inlet 422 to the outlet 424 is generated. For example, the liquid may be ultra-pure water. In this way the cleaning fluid is in contact with the liquid of the liquid seal 420 but not in contact with any gas from the surrounding gas atmosphere. Thereby foaming can be avoided. Furthermore, the liquid from the seal 420 helps thermally condition the surface to help maintain a substantially constant temperature of the surface during cleaning.

As is illustrated in FIG. 9 an accelerator 450 may be provided or operable in space 411 to aid in cleaning. The accelerator 450 may be an agitation means. The agitation means may be any device or system which agitates the cleaning fluid in the space 411. The agitation means may include, but is not limited to, a magnetic stirrer. The accelerator 450 may include, but is not limited to, a heater, an electromagnetic radiation source (for example UV radiation, desirably from a 185 nm Mercury lamp) or a sonic transducer (for example an ultrasonic or a mega sonic transducer). A combination of these accelerators may be present. An accelerator of the type mentioned above could be present in any embodiment.

An advantage of providing the liquid seal 420 with ultra-pure water is that a drying stain on the top surface of the substrate table WT may be avoided. This is because the flow of ultra-pure water effectively removes the cleaning solvent. By keeping the cleaning solvent away from the meniscus between the liquid of the liquid seal 420 and the surrounding gas of the atmosphere the surface tension of the meniscus will remain substantially constant so that meniscus instability may be avoided. Having the outlet 424 outward of the inlet 422 may help to prevent cleaning fluid entrained in the liquid seal from reaching the radial outward meniscus of the liquid seal 420. Meniscus instability may lead undesirably to liquid loss.

Although this embodiment has been illustrated as providing a member 420 to clean the top surface of the substrate table, the same principles can be used to cleaning another surface. One or both inlets 410, 422 and/or one or both outlets 412, 424 could be provided in the substrate table WT. This would be suitable in order to clean the under surface of the liquid handling system, for example in a way similar to that illustrated in FIG. 7. Further the inlets and outlets may be provided in the liquid handling system itself, so that the barrier member 12 functions as the cleaning station 400. Any such embodiments make use of a liquid seal to seal at least around part of a space to which cleaning fluid is introduced. In this way gas surrounding the space is hindered from entering the space and the occurrence of foaming can be reduced.

Figure 11:
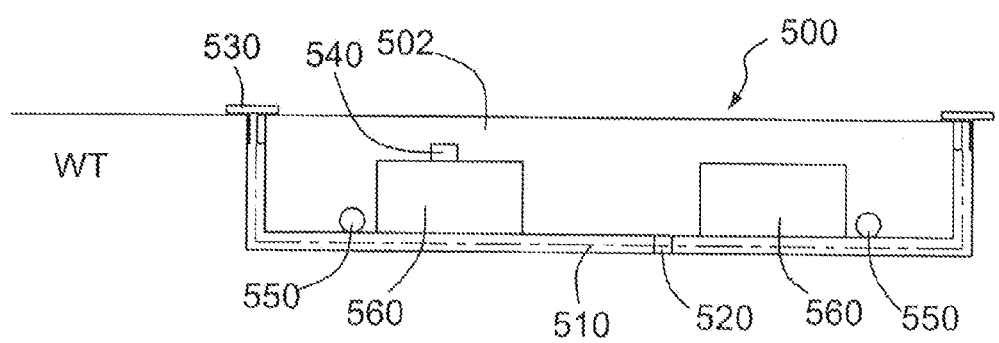
FIG. 11 illustrates, in cross-section, a thermally isolated part of a substrate table.

Other surfaces which the cleaning station 400 could be used to clean (or the principles of any of the other described embodiments could be used to clean) are components on the substrate table WT. These may include any of the sensors 610 (illustrated in FIG. 12) and any seals (for example seals between the top surface of the substrate table WT and an object mounted on the substrate table WT—for example a cover 530 such as illustrated in FIG. 11). These features can collect debris such as resist and topcoat flakes.

Figure 10:
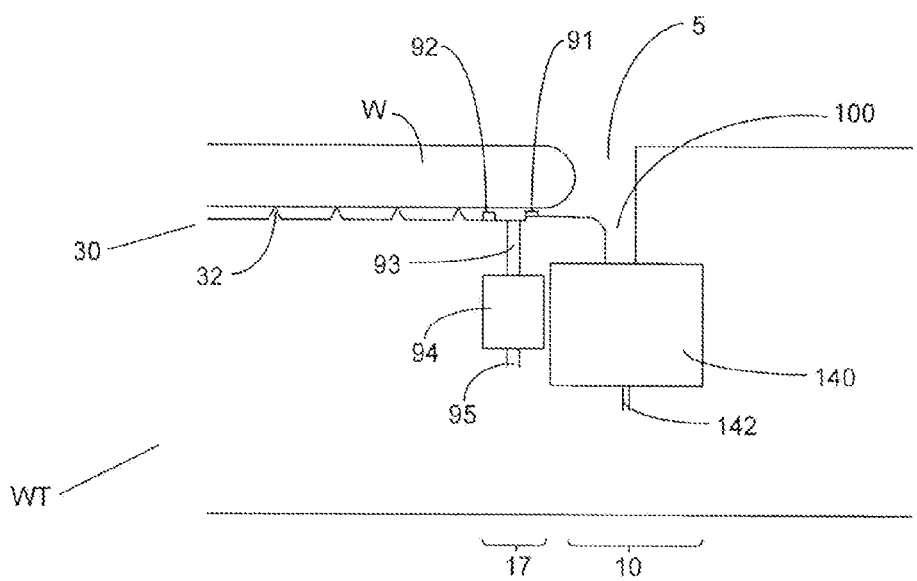
FIG. 10 illustrates, in cross-section, the area of a substrate table next to the edge of the substrate.

FIG. 10 illustrates three further specific features which may be cleaned by the cleaning station 400. These are first and second drains 10, 17 and substrate supporting area 30. Through use, the surfaces of these features are seen to change contact angle with immersion fluid, degrading their performance. Cleaning these features may improve performance again. An explanation of the features follows.

A gap 5 exists between an edge of the substrate W and an edge of the substrate table WT. The gap 5 is at an outer area or edge of a recess in which the substrate is placed during imaging. The substrate W can be supported on a substrate supporting area 30 of the substrate table WT. In an immersion lithography machine using a localized area liquid supply system, when the edge of the substrate W is being imaged (or at other times such as when the substrate W first moves under the projection system PS, as described above), a gap 5 between the edge of the substrate W and the edge of the substrate table WT will pass under, for example, the space 11 filled with liquid. This can result in liquid from the space 11 entering the gap. In other liquid supply systems, liquid can enter the gap 5 at any time.

In order to deal with the liquid entering that gap, at least one drain 10, 17 may be provided at the edge of the substrate W to remove any liquid which enters the gap 5. In the embodiment of FIG. 10, two drains 10, 17 are illustrated though there may be only one drain or there could be more than two drains. The drains 10, 17 are, for example, annular so that the whole periphery of the substrate W is surrounded. The openings of the drains may be continuous or discontinuous.

The primary function of the first drain 10 is to help prevent bubbles of gas from entering the liquid 11 of the liquid handling system 12. Any such bubbles can deleteriously affect the imaging of the substrate W. The second drain 17 may be provided to prevent any liquid which finds its way from the gap 5 to underneath the substrate W from preventing efficient release of the substrate W from the substrate table WT after imaging. The substrate W is held on a substrate supporting table by a pimple table 30 comprising a plurality of projections 32. An underpressure applied between the substrate W and the substrate table WT by the pimple table 30 helps ensure that the substrate W is held firmly in place. However, if liquid gets between the substrate W and the pimple table 30, this can lead to difficulties, particularly when unloading the substrate W. The provision of the second drain 17 under the pimple table 30 helps reduce or eliminate problems which may occur due to liquid finding its way underneath the substrate W.

The first drain 10 removes liquid by way of an under pressure. That is, the first drain 10 is connected via outlet 142 to an under pressure source. This under pressure source effectively removes any liquid which enters the drain. The under pressure source is effective to draw gas in from outside of the gap 5 above the substrate table WT through the drain 10 and out through the outlet 142. Measures may be taken only to connect the outlet 142 to the under pressure source when there is a chance of liquid entering the gap 5.

The exact geometry of the first drain 10 is not important. Typically the first drain 10 comprises an inlet 100 which puts a chamber 140 into fluid communication with the gap 5. The chamber 140 may be annular, for example. The outlet(s) 142 is in fluid communication with the chamber 140. Other geometries may be possible, including further chambers. The chamber is useful in helping to damp pressure variations and thereby reduce vibrations. The drawing of gas and/or liquid through the inlet 110 (which may be a continuous groove or a plurality of individual through holes) can lead to the evaporation of liquid which has entered the gap 5. The evaporation of liquid leads to localized cooling. Localized cooling can result in mechanical contractions of the surrounding substrate table WT which in turn may lead to overlay errors.

The second drain 17 will now be described. An outlet 95 of the second drain 17 is held at an under pressure (e.g. 0.6 bar) which is a little larger than the under pressure (e.g. 0.5 bar) of the pimple table 30. This helps ensure that there is a flow of gas from the pimple table 30 as well as from the gap 5 to the outlet 95. In an embodiment, the second drain 17 can be held at an over pressure. In this case there is a flow of gas out of the outlet 95 towards the gap 5. Combined with capillary pressure this can be used to reduce or prevent immersion liquid getting onto the pimple table 30.

As can be seen, two projections 91 and 92 are provided underneath the substrate W. The radially outer projection 91 is a so-called "wet seal" and is likely to have immersion liquid passing between it and the bottom surface of the substrate W. The radially inner projection 92 is a dry seal and only gas is likely to pass between it and the substrate W.

Between the two projections 91, 92 is a channel 93 which leads to a chamber 94. The chamber 94 is in fluid communication with the outlet 95 which is connected to the under pressure source. More detail of this second drain 17 and of the first drain 10 can be found in US Patent Publication No. US 2008-0297744.

As mentioned above, if the liquid handling system spends a period of time at a given position on the substrate table WT, for example during cleaning or while waiting for the next substrate table to be ready for substrate swap, an unexpected heat load may be applied to the substrate table WT. This can result in overlay errors. A way to alleviate this difficulty is to provide a thermally isolated island or area on the substrate table WT. Thus in an embodiment of the present invention any of the cleaning stations can be positioned on a thermally isolated island to avoid difficulties with thermal expansion/contraction.

FIG. 11 shows in cross-section such a thermally isolated island in a substrate table WT. The thermally isolated island 500 comprises a member 502 which is separate from the remainder of the substrate table WT. A gas, e.g., air, gap 510 is positioned between the member 502 and the remainder of the substrate table WT. That is, the member 502 sits in a recess in the top surface of the substrate table WT and is supported on the substrate table WT by a insulated foot 520. There could, for example, be three insulated feet 520 supporting the member 502. The gap 510 may be about 1 mm at the bottom and about 0.75 mm at the sides. At the very top the gap may be even smaller. This is so that the gap between the substrate table WT and the member 502 can be bridged by a cover 530, e.g., a sticker, so that liquid cannot penetrate into the gap 510 when the substrate table WT moves relative to the liquid handling system to locate the liquid handling system over the member 502. That is, on transfer of the liquid handling system from being over the substrate table WT to being over the member 502.

A temperature sensor 540 measures the temperature of the member 502. Heaters 550 are used to control the temperature of the thermally isolated island 500. Operation of the sensor 540 with the heater 550 may maintain the thermally isolated island 500 at a substantially constant temperature. For this purpose a controller or software may be provided. As is illustrated in FIG. 11, chambers 560 or a single annular chamber 560 may be provided in the member 502. The chamber(s) 560 is filled with gas, e.g., air. This feature may thermally isolate the member 502 from the table WT even more. It may reduce the heat capacity of the member 502 by reducing its thermal mass so it quickly reaches the temperature of the immersion liquid without affecting its temperature and so that it can respond to the heater 550 quickly.

If a substrate table WT is designed so that during substrate swap the substrate tables pass in unison under the projection system so that liquid is contained in the liquid handling system by the presence of one or other or both of the substrate tables, then it is desirable to have a thermally isolated island 500 positioned on each substrate table. This allows the liquid handling system to be positioned on the thermally isolated island prior to swap should there be a delay in the next substrate table being prepared. Because the liquid handling system needs to be positioned here while waiting for the next substrate table anyway, this gives a good opportunity to perform cleaning without loss in throughput. Thus a cleaning station may be located at or on the thermally isolated island 500.

Figure 12:
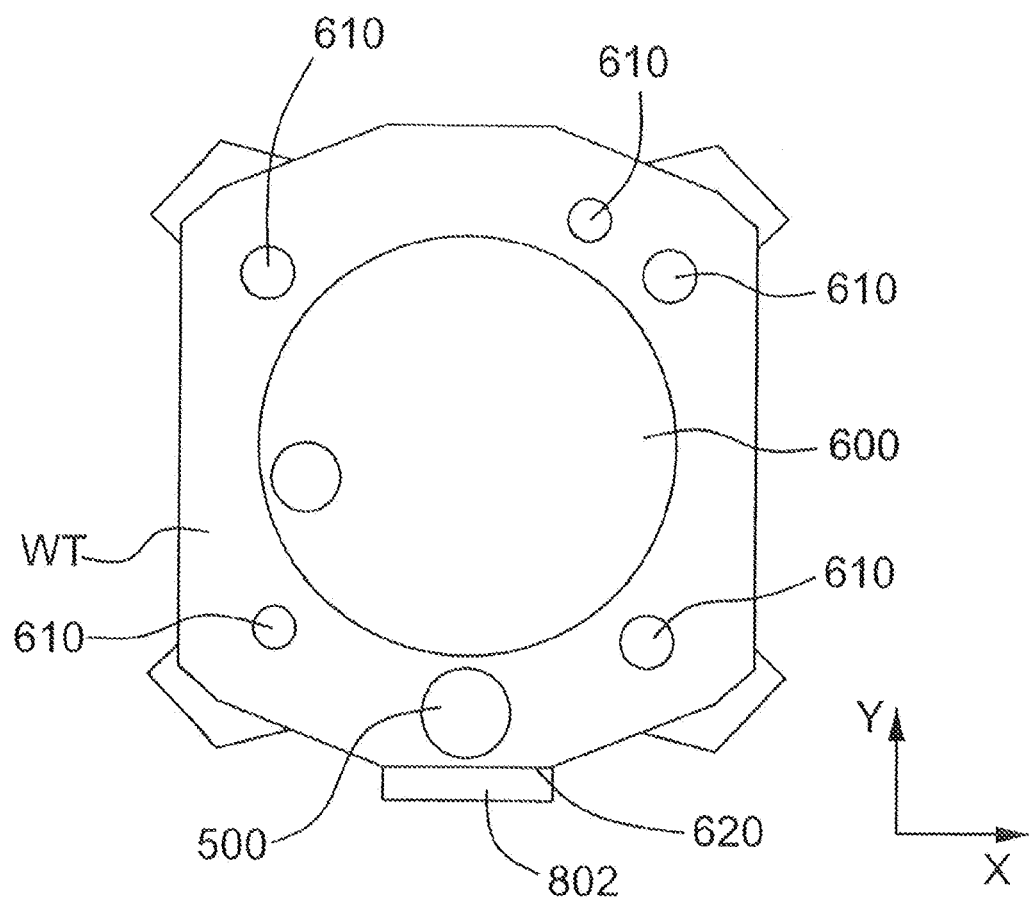
FIG. 12 illustrates, in plan, the top surface of a substrate table.

FIG. 12 shows, in plan, such a substrate table WT. Such a substrate table WT may include a shutter surface such as a projection or bridge 602 (such as a rotatable or retractable bridge) used for substrate swap as described in United States Patent Application Publication No. US 2007-0216881. As can be seen, the substrate table WT has a central section 600 for the positioning of the substrate W thereon. Various sensors 610 are present. This leaves four potential areas for the position of the thermally isolated island 500. These are substantially in the middle of each edge. The optimal position for the thermally isolated island 500 is on the edge at which substrate swap will take place. As is illustrated in FIG. 12, the bottom edge 620 is the side at which the substrate table WT illustrated will dock with the next substrate table WT. Therefore the thermally isolated island 500 is positioned in the middle of that edge. In an embodiment, the thermal island 500 may have an optimal position at another location along the edge of the substrate table WT. In an embodiment, the optimal position may be located in a corner of a substrate table WT.

The positioning of the thermally isolated island in this position may increase throughput. The throughput increase may be achieved because the substrate table WT can wait in a position ready for swap. Swap occurs once the next substrate table is in position to be translated into the position underneath the projection system PL. When swap occurs, the substrate table WT is displaced an optimally short distance, desirably the shortest distance possible to transfer the projection system between the substrate tables, keeping immersion liquid between the projection system and the shutter surface of the bridge 602 or one of the substrate tables WT or both.

A similar optimal position for a thermally isolated island may be used on a shutter member in the form of a separate table, such as a measuring table which does not support a substrate. The optimal position for a thermally isolated island on the measuring table may optimally minimize the time and displacement for transfer of tables beneath the projection system during substrate swap. This position may be on the edge of the table. The position may be at a location along the edge of the table. The position may desirably be substantially at the middle of an edge of the measuring table. Alternatively or additionally, the thermally isolated island may substantially at a corner of the measuring table.

If a cleaning station is provided on the substrate table WT, the position of the isolated island 500 is the optimal position for it. A cleaning station may be provided on a measuring table, desirably on a thermally isolated island 500. The position of the cleaning station may be optimized to help minimize the time and movement of: the substrate table during substrate swap to place the substrate table WT underneath the projection system PS; and/or of the substrate table to position the cleaning station under the projection system after and/or before exposure of a substrate W present on the substrate table WT.

All of the embodiments of FIGS. 7a, 7b, 7c, 8a, 8b and 9 provide a space which is sealed from the outside environment above, below or to the side of a surface to be cleaned. That is, the surface to be cleaned forms part of the boundary of the space. Above it is described that a cleaning liquid can be provided to those spaces through an opening. In an embodiment, additionally or alternatively, a cleaning liquid can be provided to the surface to be cleaned in the form of a spray (e.g. two-phase flow), desirably an aerosol spray. Because the space is substantially sealed, droplets of the spray are substantially contained within the space so that they do not contaminate surfaces other than the surface to be cleaned and any other surfaces defining the space. The liquid from the spray may then be collected in the same way as described above. U.S. Patent Application No. 61/006,092, filed on 18 Dec. 2007 and United States Patent Application Publication No. US 2006-0132731 A1 disclose aerosol spray cleaning in a confined space and the principles described in that application with regard to aerosol spray cleaning can equally be applied in an embodiment of the present invention. In particular, the inlets into the spaces of the embodiments of FIGS. 7a, 7b, 7c, 8a, 8b and 9 could be an aerosol spray orifice. In an embodiment, the cleaning liquid may be changed to, or additionally include, a cleaning gas (such as ozone) or a plasma or an oxidizer (optionally with UV radiation) such as dissolved $O_3$, 1% $H_2O_2$. Gaseous and plasma cleaning agents are described in United States Patent Application Publication No. US 2006-0132731 A1 and U.S. Patent Application No. 61/006,951 filed on 7 Feb. 2008 and the cleaning methods and agents described therein could be used in an embodiment of the present invention. Oxidizer cleaning agents are described in United States Patent Publication No. 2009-0027635 and the cleaning methods and agents described therein could be used in an embodiment of the present invention. Directing UV radiation for those oxidizing methods requiring such illumination may be achieved by using an optic fiber with an opening near the surface to be cleaned as described in U.S. Patent Application No. 61/006,661 filed on 25 Jan. 2008. The opening may be positioned in a place in which it is difficult to directly illuminate, for example, in a barrier member 12, a recess 210 of a cleaning station, a dummy substrate 300, within a recess defined between the two projections 340, 350, or a surface of a cleaning station 400.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

Moreover, although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. For example, it is contemplated that various combination or subcombinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. For example, the features of the seal (230, 310, 320, 340, 350) present in FIGS. 7 and 8 may be present in any workable combination in these Figures as well as FIG. 9. Immersion liquid and/or cleaning fluid may be provided and removed though openings 110, 120, 180, 220, 240, 250, 410, 412, 422 and 424 in a barrier member 12, a cleaning station 400, the substrate table WT such as in the recess 210 as shown in FIG. 7 and/or a shutter member such as the dummy substrate 300. The thermally isolated area 500 may be located in the recess 210. The recess 210 may be dimensioned to accept a cleaning station 400 for cleaning and/or storage. The space created by the seals 340, 350 may be formed in the undersurface of the cleaning station 400. Thus, it is intended that the scope of the present invention herein disclosed should not be limited by the particular disclosed embodiments described above, but should be determined only by a fair reading of the claims that follow.

According to an aspect, there is provided an immersion lithographic apparatus, comprising: an inlet configured to introduce a cleaning fluid into a space, a surface to be cleaned at least in part defining the space; and a liquid seal configured to seal around at least part of the space to hinder fluid surrounding the space from entering the space.

In an embodiment, the immersion lithographic apparatus further comprises an outlet configured to allow cleaning fluid to leave the space. In an embodiment, the liquid seal comprises an inlet for supply of liquid and an outlet for removal of liquid. In an embodiment, the inlet for supply of liquid is closer to the space than the outlet for removal of liquid. In an embodiment, the inlet for supply of liquid and the outlet for removal of liquid surround, in plan, the space. In an embodiment, the inlet configured to introduce cleaning fluid and a feature of the liquid seal are formed in a fluid handing structure which has a surface which at least partly defines the space. In an embodiment, the surface to be cleaned is a top surface of a substrate table. In an embodiment, the immersion lithographic apparatus further comprises a cleaning accelerator device operable in the space. In an embodiment, the cleaning accelerator device comprises (i) a stirrer, or (ii) a heater, or (iii) an ultraviolet radiation source, or (iv) a sonic transducer, or (v) any combination selected from (i)-(iv). In an embodiment, the cleaning fluid is a foamable cleaning fluid. In an embodiment, the foamable cleaning fluid is PGMEA. In an embodiment, the seal is configured to use ultra-pure water. In an embodiment, the inlet configured to introduce cleaning fluid and the liquid seal are on a fluid handling structure. In an embodiment, the inlet configured to introduce cleaning fluid and a feature of the liquid seal are located on a substrate table. In an embodiment, the inlet configured to introduce cleaning fluid and the feature of the liquid seal are on a thermally isolated island of the substrate table. In an embodiment, the surface to be cleaned is on a fluid handling structure. In an embodiment, the inlet configured to introduce cleaning fluid and a feature of the liquid seal are separate from a substrate table.

According to an aspect, there is provided an immersion lithographic apparatus, comprising: a substrate table configured to hold a substrate; and a fluid handling structure configured to provide liquid to a space between a projection system and the substrate and/or substrate table, wherein the substrate table comprises a thermally isolated area of a top surface which is thermally isolated from the remainder of the substrate table, the thermally isolated area being next to an edge of the substrate table which edge passes under the fluid handling structure during movement of the substrate table from under the projection system.

In an embodiment, the thermally isolated area is of a size, in plan, greater than an area to which the fluid handling structure applies liquid. In an embodiment, the immersion lithographic apparatus further comprises a cleaning station located on the thermally isolated area.

According to an aspect, there is provided an immersion lithographic apparatus, comprising: a fluid handling structure configured to provide liquid to a space between a projection system and a substrate and/or substrate table; a cleaning station comprising a surface; an inlet configured to provide cleaning fluid between the fluid handling structure and the surface; and a seal radially inwardly of the inlet configured to seal between the fluid handling structure and the surface to hinder passage of cleaning fluid to the projection system.

In an embodiment, the seal is a physical seal. In an embodiment, the physical seal is a projection. In an embodiment, the physical seal is a ring. In an embodiment, the inlet is defined in the surface. In an embodiment, the immersion lithographic apparatus further comprises an outlet configured to remove cleaning fluid, the outlet being defined in the surface. In an embodiment, the immersion lithographic apparatus further comprises a further inlet configured to increase a pressure under the projection system. In an embodiment, the further inlet is defined in the substrate table. In an embodiment, the surface is a surface of a moveable shutter member removable from the substrate table. In an embodiment, the fluid handling structure comprises an inlet connected to an under pressure to attach the moveable shutter member to the fluid handling structure. In an embodiment, the seal is configured to seal between an inner edge of a bottom surface of the fluid handling structure and an extractor in the bottom of the fluid handling structure. In an embodiment, the immersion lithographic apparatus further comprises a further seal, the further seal being radially outwardly of the seal. In an embodiment, the inlet is defined in the fluid handling structure. In an embodiment, the immersion lithographic apparatus further comprises a further inlet configured to provide a liquid to a space bounded by the projection system. In an embodiment, the further inlet is defined in the fluid handling structure. In an embodiment, defined in the surface is a recess configured to accept the fluid handling structure. In an embodiment, the surface is a surface of a substrate table.

According to an aspect, there is provided a cleaning station for an immersion lithographic apparatus comprising a fluid handling structure configured to provide liquid to a space between a projection system and a substrate and/or substrate table, the cleaning station comprising: a surface; an inlet configured to provide cleaning fluid between the fluid handling structure and the surface; and a seal radially inwardly of the inlet configured to seal between the fluid handling structure and the surface to hinder passage of cleaning fluid to the projection system.

According to an aspect, there is provided a device manufacturing method using an immersion lithographic apparatus, the method comprising: introducing cleaning fluid into a space through an inlet, the space being defined at least in part by a surface to be cleaned; and sealing a liquid seal around at least part of the space to hinder fluid surrounding the space from entering the space.

According to an aspect, there is provided a device manufacturing method, the method comprising: supporting a substrate on a substrate table comprising a thermally isolated area; providing liquid from a fluid handling structure to a space between a projection system and the substrate and/or substrate table, the thermally isolated area being part of a top surface which is thermally isolated from the remainder of the substrate table; and passing the thermally isolated area under the fluid handling structure during movement of the substrate table from under the projection system, wherein the thermally isolated area is positioned next to an edge of the substrate table.

According to an aspect, there is provided a device manufacturing method, using an immersion lithographic apparatus, the method comprising: providing liquid from a fluid handling structure to a space between a projection system and a substrate and/or substrate table; providing cleaning fluid from an inlet to between the fluid handling structure and a surface of a cleaning station; and sealing between the fluid handling structure and the surface using a seal placed radially inwardly of the inlet, to hinder passage of cleaning fluid to the projection system.

The descriptions above are intended to be illustrative, not limiting. Thus, it will be apparent to one skilled in the art that modifications may be made to the invention as described without departing from the scope of the claims set out below.

The invention claimed is:

1. An immersion lithographic apparatus, comprising:
an immersion liquid supply system to provide immersion liquid via an immersion liquid inlet;
a projection system to project a beam of radiation through the immersion liquid onto a radiation-sensitive substrate;
an inlet configured to introduce a cleaning fluid of a different material than the immersion liquid into a space, a surface to be cleaned at least in part defining the space, the inlet connected to a first opening connected or connectable to a cleaning fluid supply; and
a liquid seal configured to seal around at least part of the space to hinder fluid surrounding the space from entering the space, wherein the liquid seal comprises a seal inlet configured to supply liquid of a different material than the cleaning fluid when there is cleaning fluid in the space, the seal inlet connected to a second opening connected or connectable to a supply of the liquid of the different material than the cleaning fluid,
wherein the inlet or the seal inlet is different from the immersion liquid inlet.

2. The immersion lithographic apparatus of claim 1, further comprising an outlet configured to allow cleaning fluid to leave the space.

3. The immersion lithographic apparatus of claim 1, wherein the liquid seal further comprises a seal outlet for removal of liquid.

4. The immersion lithographic apparatus of claim 3, wherein the seal inlet is closer to the space than the seal outlet.

5. The immersion lithographic apparatus of claim 1, wherein the inlet configured to introduce cleaning fluid and a feature of the liquid seal are formed in a fluid handing structure which has a surface which at least partly defines the space.

6. The immersion lithographic apparatus of claim 1, wherein the surface to be cleaned is a top surface of a substrate table.

7. The immersion lithographic apparatus of claim 1, further comprising a cleaning accelerator device operable in the space.

8. The immersion lithographic apparatus of claim 1, wherein the cleaning fluid is a foamable cleaning fluid.

9. The immersion lithographic apparatus of claim 1, wherein the inlet configured to introduce cleaning fluid and the liquid seal are on a fluid handling structure.

10. The immersion lithographic apparatus of claim 1, wherein the inlet configured to introduce cleaning fluid and a feature of the liquid seal are located on a substrate table.

11. An immersion lithographic apparatus, comprising:
a substrate table configured to hold a substrate;
a fluid handling structure configured to provide liquid to a space between a projection system and the substrate and/or substrate table,
wherein the substrate table comprises a thermally isolated area of a top surface which is thermally isolated from the remainder of the substrate table, the thermally isolated area being next to an edge of the substrate table which edge passes under the fluid handling structure during movement of the substrate table from under the projection system and the thermally isolated area comprising a heat transfer device;
a sensor to measure a temperature of the thermally isolated area; and
a controller to control heat transfer by the heat transfer device based on the measured temperature.

12. An immersion lithographic apparatus, comprising:
a fluid handling structure configured to provide liquid to a space between a projection system and a substrate and/or substrate table;
a cleaning station comprising a surface;
an inlet configured to provide cleaning fluid between the fluid handling structure and the surface, the cleaning fluid substantially not in contact with the projection system; and
a seal radially inwardly of the inlet configured to seal between the fluid handling structure and the surface, wherein the seal is oriented to hinder passage of cleaning fluid to the projection system.

13. A cleaning station for an immersion lithographic apparatus comprising a fluid handling structure configured to provide liquid to a space between a projection system and a substrate and/or substrate table, the cleaning station comprising:
a surface;

an inlet configured to provide cleaning fluid between the fluid handling structure and the surface, the cleaning fluid substantially not in contact with the projection system; and a seal radially inwardly of the inlet configured to seal between the fluid handling structure and the surface, wherein the seal is oriented to hinder passage of cleaning fluid to the projection system.

14. A device manufacturing method using an immersion lithographic apparatus, the method comprising:

providing immersion liquid, using an immersion liquid supply system, to a space between a projection system and a radiation-sensitive substrate;

projecting a beam of radiation from the projection system through the immersion liquid onto the radiation-sensitive substrate;

introducing cleaning fluid of a different material than the immersion liquid into a space through an inlet, the space being defined at least in part by a surface to be cleaned; and sealing a liquid seal around at least part of the space to hinder fluid surrounding the space from entering the space, the sealing comprising supplying liquid of a different material than the cleaning fluid when there is cleaning fluid in the space.

15. The method of claim 14, wherein the cleaning fluid is a foamable cleaning fluid.

16. The method of claim 14, wherein the inlet configured to introduce cleaning fluid and a feature of the liquid seal are located on a movable table.

17. The method of claim 14, further comprising removing liquid using a seal outlet, wherein an inlet to supply the liquid of a different material than the cleaning fluid is closer to the space than the seal outlet.

18. The method of claim 14, wherein the inlet to introduce the cleaning fluid and the liquid seal are on a fluid handling structure.

19. A device manufacturing method, the method comprising:

supporting a substrate on a substrate table comprising a thermally isolated area;

providing liquid from a fluid handling structure to a space between a projection system and the substrate and/or substrate table, the thermally isolated area being part of a top surface which is thermally isolated from the remainder of the substrate table and the thermally isolated area comprising a heat transfer device;

passing the thermally isolated area under the fluid handling structure during movement of the substrate table from under the projection system, wherein the thermally isolated area is positioned next to an edge of the substrate table;

measuring a temperature of the thermally isolated area using a sensor; and controlling heat transfer by the heat transfer device based on the measured temperature.

20. A device manufacturing method, using an immersion lithographic apparatus, the method comprising:

providing liquid from a fluid handling structure to a space between a projection system and a substrate and/or substrate table;

providing cleaning fluid from an inlet to between the fluid handling structure and a surface of a cleaning station, and the cleaning fluid being substantially not in contact with the projection system;

sealing between the fluid handling structure and the surface using a seal placed radially inwardly of the inlet, the seal oriented to hinder passage of cleaning fluid to the projection system.

* * * * *

UNITED STATES PATENT AND TRADEMARK OFFICE
CERTIFICATE OF CORRECTION

PATENT NO. : 8,823,918 B2  
APPLICATION NO. : 12/428237  
DATED : September 2, 2014  
INVENTOR(S) : Robert Douglas Watso et al.

It is certified that error appears in the above-identified patent and that said Letters Patent is hereby corrected as shown below:

On title page, item (75) Inventors, Line 18  
      replace "Naer (NL)"  
      with --Neer (NL)--.

Signed and Sealed this  
Sixteenth Day of December, 2014

Michelle K. Lee  
*Deputy Director of the United States Patent and Trademark Office*